(12) United States Patent
Akizuki

(10) Patent No.: US 6,923,406 B2
(45) Date of Patent: Aug. 2, 2005

(54) FIXING MEMBER FOR FIXING AN OBJECT TO BE ATTACHED TO A PLATE AND CLAMP WITH THE FIXING MEMBER

(75) Inventor: Hideaki Akizuki, Nagoya (JP)

(73) Assignee: Kitagawa Industries Co., Ltd., Nagoya (JP)

( * ) Notice: Subject to any disclaimer, the term of this patent is extended or adjusted under 35 U.S.C. 154(b) by 0 days.

(21) Appl. No.: 10/701,194

(22) Filed: Nov. 4, 2003

(65) Prior Publication Data

US 2004/0089770 A1 May 13, 2004

Related U.S. Application Data

(62) Division of application No. 09/923,743, filed on Aug. 7, 2001, now Pat. No. 6,669,149.

(30) Foreign Application Priority Data

Aug. 9, 2000 (JP) ........................................ 2000-241283
Nov. 27, 2000 (JP) ........................................ 2000-359448

(51) Int. Cl.⁷ .............................................. F16B 45/00
(52) U.S. Cl. ........................ 248/71; 248/73; 248/222.12
(58) Field of Search ........................... 248/71, 73, 74.3, 248/222.12, 222.11; 24/16 PB, 297, 289

(56) References Cited

U.S. PATENT DOCUMENTS

| | | | |
|---|---|---|---|
| 2,059,429 A | 11/1936 | Anderson | 174/136 |
| 3,235,209 A | 2/1966 | Seckerson et al. | 24/339 |
| 3,423,055 A | 1/1969 | Fischer | 24/339 |
| 3,588,018 A | 6/1971 | Harlow | 248/222.12 |
| 4,457,482 A | 7/1984 | Kitagawa | 248/73 |
| 4,564,163 A | 1/1986 | Barnett | 24/16 PB |
| 4,677,714 A | 7/1987 | Wright | 24/297 |
| 4,681,288 A | 7/1987 | Nakamura | 24/453 |
| 4,682,748 A | 7/1987 | Freudenmann et al. | 248/205.3 |
| 5,129,607 A | 7/1992 | Satoh | 248/73 |
| 5,368,261 A | 11/1994 | Caveney et al. | 248/69 |
| 5,667,177 A | 9/1997 | Van Leeuwen et al. | 248/73 |
| 6,209,827 B1 | 4/2001 | Kawai | 248/49 |
| 6,216,987 B1 | 4/2001 | Fukuo | 248/229.16 |

FOREIGN PATENT DOCUMENTS

| | | | | |
|---|---|---|---|---|
| JP | 50-31247 | 3/1975 | ........... | F16B/21/00 |
| JP | 57-200703 | 12/1982 | | |
| JP | 7-20402 | 4/1995 | ............. | F16B/5/06 |
| JP | 1-26140 | 8/1998 | | |

*Primary Examiner*—Korie Chan
(74) *Attorney, Agent, or Firm*—Davis & Bujold, P.L.L.C.

(57) ABSTRACT

A clamp detachable by handling from the front side of a plate is provided. When the main body of the clamp is pressed against the plate with an abutting portion elastically deformed and a connecting portion thrust into an attachment hole, and is moved in the direction parallel to the front and reverse surfaces of the plate, a retaining portion is moved to overlap the reverse surface of the plate with a first and a second projections engaged in locating holes formed in the plate. As a result, the main body is pressed against the front surface of the plate, the retaining portion is pressed against the reverse surface of the plate, and the first and second projections engaged in locating holes prevent displacement in the direction parallel to the front and reverse surfaces of the plate, whereby the clamp is fixed to the plate.

20 Claims, 5 Drawing Sheets

1

FIXING MEMBER FOR FIXING AN OBJECT TO BE ATTACHED TO A PLATE AND CLAMP WITH THE FIXING MEMBER

This application is a divisional of U.S. application Ser. No. 09/923,743 filed Aug. 7, 2001 now U.S. Pat. No. 6,669,149 which claims priority from Japanese Application Serial No. 2000-359448 filed Nov. 27, 2000 and also claims priority from Japanese Application Serial No. 2000-241283 filed Aug. 9, 2000.

BACKGROUND OF THE INVENTION (i) Field of the Invention

The present invention relates to a fixing member for fixing an object to a plate and a clamp with the fixing member.

(ii) Description of the Related Art

Fixing members having a variety of structures have been used for fixing synthetic resin components such as a clamp or a spacer to a plate such as a printed circuit board or a housing panel. For example, Publication of Japanese Examined Utility Model Application No. 1-26140 discloses a clamp, provided with one of these fixing members at each end, for holding two plates in parallel with each other by affixing the fixing member at each end thereof to the plate.

However, the fixing member provided for the clamp disclosed in the above mentioned Publication involves the following problems:

Firstly, although the fixing member can be attached to the plate by simply inserting the same into an attachment hole from the front side of the plate, it cannot be detached so easily. Specifically, to detach the fixing member from the plate, it is necessary to reach around to the reverse side of the plate and elastically deform an elastic stopper. In short, it is impossible to detach the fixing member from the plate only from the front side of the plate.

Accordingly, if there is not a sufficient space for a hand to be inserted around the reverse side of plate, the plate itself must be removed to detach the fixing member therefrom. This leads to a disadvantage that, for example, when the fixing member is to be separately disposed at the time of discarding a product or the fixing member is to be reused, detachment of the fixing member presents a substantial amount of trouble.

Secondly, the above fixing member projects to a substantial extent on the reverse side of the plate, and therefore cannot be employed in compact, thin electronic equipment, for example, where it is difficult to provide enough space on the reverse side of the plate.

SUMMARY OF THE INVENTION

Wherefore, an object of the present invention is to provide a fixing member easily detachable by handling from the front side of a plate into which the fixing member is inserted and enabling reduction of the amount of protrusion thereof on the reverse side of the plate.

Another object of the present invention is to provide a clamp having such a fixing member as above.

To attain this and other objects, a fixing member according to the present invention comprises a support protruding from the main body, a plate-like portion provided at the end of the support, at least part of the plate-like portion extending toward the side direction of the support, an extending portion extending from the main body, the extending portion being pressed against the plate and elastically deformed when the plate-like portion is inserted into an attachment hole provided in the plate and allowing the plate-like portion to pass therethrough in order to attach the fixing member to the plate, an abutting portion provided in the plate-like portion for abutting the plate, wherein when the plate-like portion is inserted into the attachment hole and slid in the extending direction of the plate-like portion in order to elastically deform the extending portion, the abutting portion abuts the plate surface around the circumference of the attachment hole at a predetermined abutting position by receiving elastic restoring force of the extending portion, and displacement preventing means for preventing the abutting portion from being displaced from the predetermined abutting point.

A variety of elements can be employed as the displacement preventing means in the above fixing member. An example of the displacement preventing means is a projection provided at the end of the extending portion and engageable with a locating hole provided in the plate. Another example is an engagement projection disposed on the abutting portion of the plate-like portion so as to face the support and engageable with an engagement hole or an engagement recess provided in the plate.

In the fixing member, at least part of the main body preferably is elastically deformable. By this, when the main body is pressed against the plate, part of the main body is elastically deformed, with the result that the plate-like member, the support and the engagement projection are displaced relative to the plate and the engagement projection is disengaged from the plate.

A clamp according to the present invention is provided by providing attaching means for attaching an object to be fixed on the main body.

One example of the clamp is a spacer formed by providing the fixing members at both ends of the main body serving as a support. In this case, the spacer is arranged between two plates to affix each fixing member at each end thereof to each plate. Another example is a cable holder configured by providing the fixing member on the main body capable of holding a cable and the like. In this case, by holding the cable with the cable holder fixed to the plate with the fixing member, wiring of the cable over the plate surface is enabled.

A fixing structure according to the present invention comprises a retaining member located separately from and also facing the main body for clamping a component between the retaining member and the main body, a connecting member for connecting the main body to the retaining member such that at least part of the component is clamped therebetween, and a projection provided to the retaining member for being engaged with the component when at least part of the component is clamped between the main body and the retaining member, thereby preventing the object from moving in the direction of coming out from between the main body and the retaining member. At least part of the main body is elastically deformable and when the main body is pressed against the component surface, part of the main body is elastically deformed, with the result that the retaining member, the connecting member and the projection are displaced relative to the, component and the projection is disengaged from the component.

In the fixing structure described above, the main body preferably has a second projection projecting toward the first projection and engageable with a locating hole provided in the component. Thus, the first projection and the second projection cooperatively prevent the component further effectively from coming out from between the main body and the retaining member.

BRIEF DESCRIPTION OF THE DRAWINGS

Preferred embodiments of the present invention will now be described with reference to the drawings in which.

DETAILED DESCRIPTION OF PREFERRED EMBODIMENTS

First Embodiment

Figure 1A:
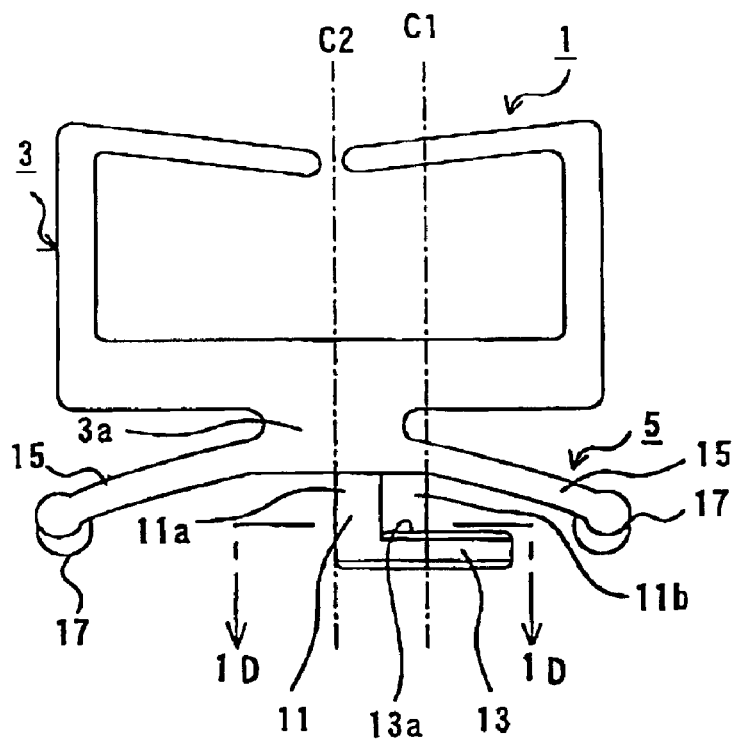
FIGS. 1A, 1B, 1C and 1D are a front view, a right side view, a bottom view and a sectional view taken along line 1D—1D shown in FIG. 1A, respectively, of a clamp according to a first embodiment of the present invention.
Figure 1B:
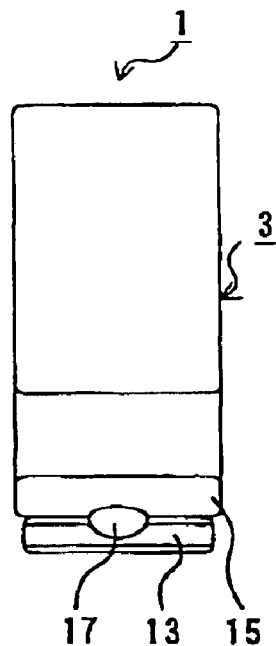
Figure 1C:
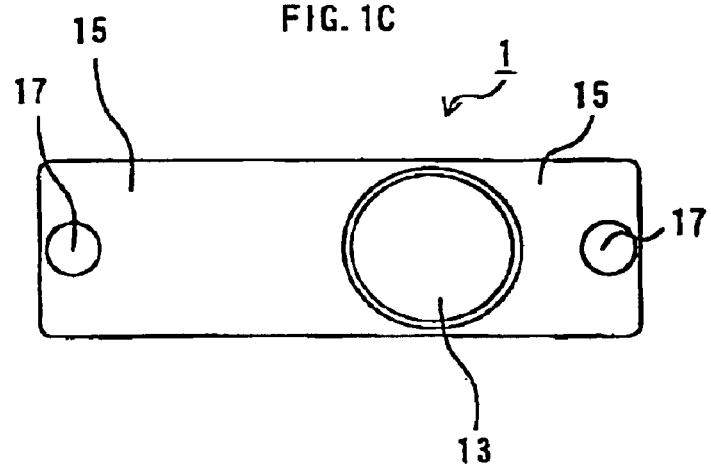
Figure 1D:
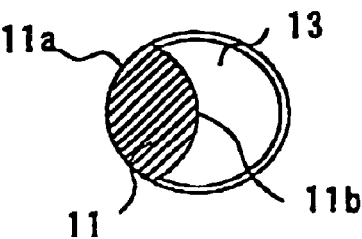
Figure 2A:
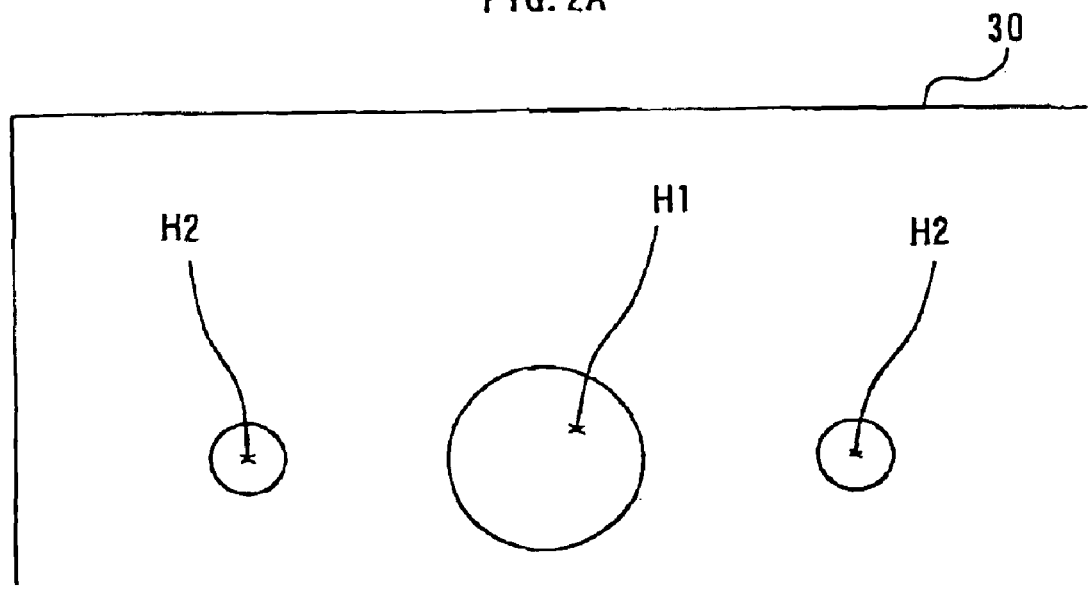
FIG. 2A is a plan view showing a plate with an attachment hole and locating holes.

As shown in FIGS. 1A through 1D, clamp 1 is provided with a main body 3 capable of holding a bundle of electrical wires by surrounding the bundle and a fixing member 5 provided on the main body 3 for affixing the main body 3 to a plate 30 (See FIG. 2A). The main body 3 and the fixing member 5 are formed integrally with each other out of a synthetic resin material.

The main body 3 has an approximately C-shaped configuration when seen from the front direction, and the bundle of electrical wires can be introduced into the inside of the main body 3 through the ring opening thereof.

The fixing member 5 comprises a support 11 protruding from a base 3a of the main body a, a circular disc 13 provided at the end of the support 11, two elastically deformable extending portions 15 extending from the base 3a of the main body 3, and projections 17 provided at respective ends of the extending portions 15.

The support 11 has a side surface comprising a first curved surface 11a corresponding to part of a cylinder and a second curved surface 11b corresponding to part of another cylinder. An axis C1 which is the center of curvature of the first curved surface 11a deviates from an axis C2 which is the center of the main body 3. The center of curvature of the second curved surface 11b is located on the axis C2 as the center of the main body 3. Either of the curvature radius of the first curved surface 11a and the curvature radius of the second curved surface 11b corresponds to the distance between the axis C1 and the axis C2.

The circular disc 13 has the center located on the axis C1 and the same radius as the curvature radius of the first curved surface 11a. Therefore, while the support 11 is within the range between the axis C1 and the axis C2, part of the circular disc 13 extends toward the side direction of the support 11 to outreach the axis C1.

The extending portion 15 is a plate-like portion which curves in the direction receding from the main body 3 while defining a gentle arc.

The projection 17 has an outer surface configured into a shape corresponding to part of a sphere.

To attach the clamp 1 having above described structure to a plate 30, a circular attachment hole H1 and two circular locating holes H2 are previously bored in the plate, as shown in FIG. 2A. The attachment hole H1 has a diameter slightly larger than the diameter of the circular disc 13. The locating hole H2 has a diameter slightly larger than the diameter of the projection 17. The distance between the attachment hole H1 and the locating hole H2 is determined in accordance with the distance between the circular disc 13 and the projection 17.

When the circular disc 13 and the support 11 are inserted into the attachment hole H1 from the front side of the plate 30, the projections 17 provided at respective ends of the extending portions 15 abut the surface of the plate 30, with the result that the extending portions 15 are elastically deformed and the projections 17 become pressed against the surface of the plate 30. When the clamp 1 (the fixing member 5) is then slid in the direction parallel with the surface of the plate 30, an abutting portion 13a of the circular disc 13 extending toward the side direction of the support 11 is moved to the point where it overlaps the plate, and the abutting portion 13a abuts the surface of the plate 30 around the circumference of the attachment hole H1 in the plate 30.

At the same time, the projections 17 are moved until they are positioned exactly in the locating holes H2. Then, the projections 17, which are biased by the elastically deformed extending portions 15, engage with the locating holes H2, with the result that the clamp 1 (the fixing member 5) is affixed to the plate 30.

When the projections 17 are moved to the locating holes H2, by simply sliding the fixing member 5 along the inner circumference of the attachment hole H1 while keeping the second curved surface 11b of the support 11 in contact with the inner circumference, the projections 17 can finally be positioned exactly in the locating holes H2. As a result, subtle adjustment of position is not necessary to ensure engagement of the projections 17 with the locating holes H2, and therefore good operating efficiency during attaching operation is achieved.

To detach the clamp 1 (the fixing member 5) from the plate 30, while imposing a force strong enough to make the projections 17 come off the locating holes H2 on the clamp 1 (the fixing member 5), the clamp 1 (the fixing member 5) is slid in the direction parallel with the surface of the plate 30. When the circular disc 13 is located exactly in the attachment hole H1, the circular disc 13 and the support 11 can easily be pulled out of the attachment hole H1 to the front side of the plate 30 without having the circular disc 13 caught by the circumference of the attachment hole H1.

When the circular disc 13 is moved to the attachment hole H1, by merely making the first curved surface 11a of the support 11 abut the inner circumference of the attachment hole H1, the circular disc 13 can be positioned exactly in the attachment hole H1. Then, by only pulling the support 11 and the circular disc 13 out of the attachment hole H1, the fixing member 5 can be pulled out of the attachment hole H1 without having the circular disc 13 caught by the plate 30. Thus, good operating efficiency during detaching operation is also achieved.

Figure 2B:
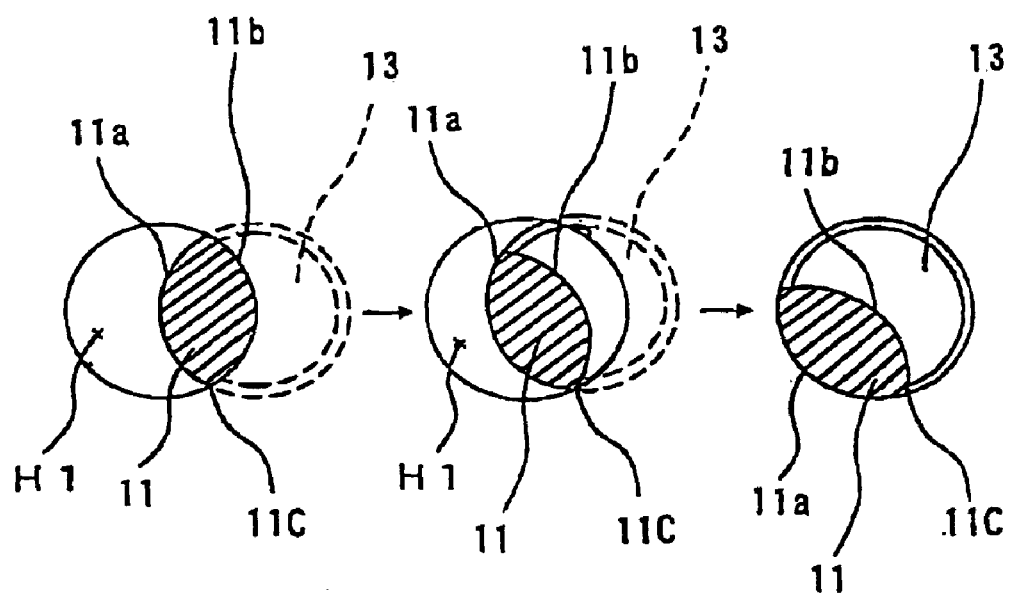
FIG. 2B is an explanatory view showing the state of movement of a support and a circular disc relative to the attachment hole.

Unlike the case with a rectangular attachment hole, it is only necessary to twist the clamp 1 such that the support 11 is turned around the ridge 11c defining the boundary between the first curved surface 11a and the second curved surface 11b of the support 11, as shown in FIG. 2B, instead of sliding the clamp 1 in a specific direction. When the first surface 11a abuts the inner circumference of the attachment hole H1, the fixing member 5 can be smoothly pulled out of the attachment hole H1 by simply pulling the support 11 and the circular disc 13 out of the attachment hole H1.

As described above, the clamp 1 provided with the fixing member 5 can be detached from plate 30 by mere handling of the same on the front side of the plate 30 without reaching around to the reverse side of the plate 30. Therefore, even if there is not room enough for a hand to be inserted behind on the reverse side of the plate 30, the clamp 1 (the fixing member 5) can easily be detached. This enables detachment of the clamp 1 with less trouble compared with a conventional clamp when, for example, the clamp 1 is to be separately disposed at the time of discarding a product, or the clamp 1 is to be reused.

Furthermore, the clamp I facilitates a relatively small structure of the portion protruding from the reverse side of the plate 30 compared with a conventional clamp, and therefore a small amount of protrusion on the reverse side of the plate 30 can be achieved while ensuring a sufficiently high attachment strength and high operating efficiency during attaching/detaching operation. Therefore, it is possible to miniaturize electronic equipment by reducing the necessary space on the reverse side of the plate 30.

Although the present invention has been described with reference to the preferred embodiment, it is to be appreciated that the present invention should not be limited to the embodiment and various modifications may be made.

For example, while the clamp 1 is provided with two projections 17 in the present embodiment, the number of projections may be one, or three or more.

Also, while the clamp 1 comprises the circular disc 13 to be caught on the reverse side of the plate 30, a plate having a polygonal shape such as a square or one of other shapes may be employed instead of the circular disc 13. In this case, a hole having the corresponding shape is provided in the plate 30.

Additionally, while a clamp for holding a bundle of electrical wires is described in the above embodiment, a fixing member according to the present invention may be applied to any member to be attached to a plate. One application is a spacer comprising a support provided with fixing members at both ends thereof Such a spacer can be attached/detached by the handling on the front side of the plate and achieve a reduced amount of protrusion on the reverse side of the plate.

Second Embodiment

As shown in FIGS. 3A through 3D, a clamp 100 is provided with a main body 103, a connecting portion 105, a retaining portion 107, a first projection 109, and a second projection 111, which are formed integrally with one another out of a synthetic resin material.

The main body 103 comprises an electrical wire bundle holding portion 103a having an approximately C-shaped configuration when seen from the front direction for enabling introduction of an electrical wire bundle into the inside thereof through the ring opening, and extending portions 103b and 103c which abut a plate and are elastically deformed when fixed to the plate.

Figure 3A:
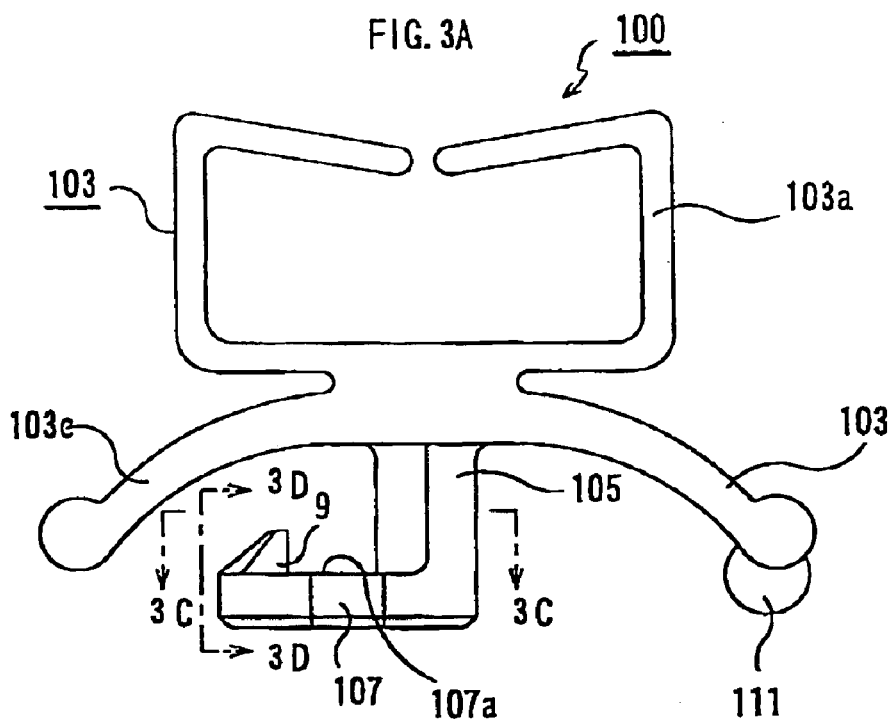
FIG. 3A is a front view of a clamp according to a second embodiment of the present invention.
Figure 3B:
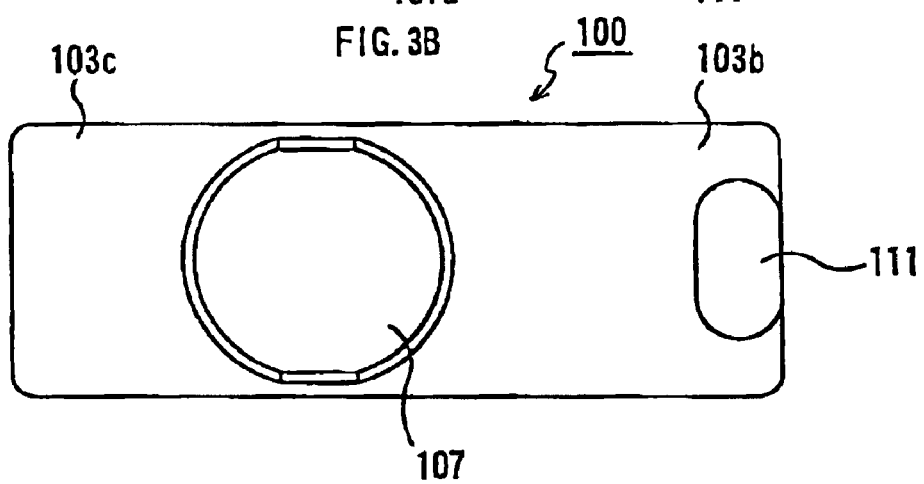
FIG. 3B is a bottom view of the clamp of FIG. 3A.
Figure 3C:
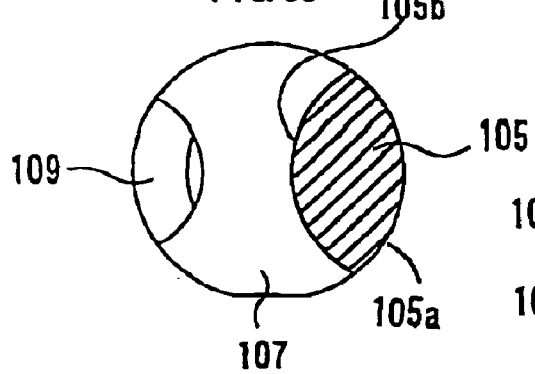
FIG. 3C is a sectional view of the clamp taken along line 3C—3C shown in FIG. 3A.
Figure 3D:
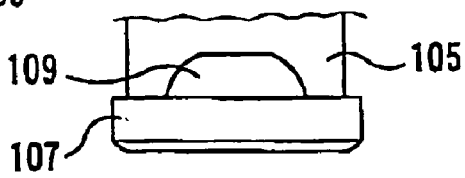
FIG. 3D is a view taken in the direction of the arrows 3D—3D shown in FIG. 3A.

The connecting portion 105 having a columnar configuration with a cross-section shown in FIG. 3C, is a support connecting the main body 103 with the retaining portion 107 such that at least a part of the plate is clamped therebetween.

The retaining portion 107 having an approximately circular configuration is provided at one end of the connecting portion 105 and includes an abutting portion 107a which abuts the plate on the upper surface thereof.

The first projection 109 protrudes from the retaining portion 107 toward the main body 103, while facing the connecting portion 105.

The second projection 111 is provided at the tip end of the extending portion.

It will now be described how to attach the clamp 100 with reference to FIGS. 3A through 3D and FIG. 4.

When the connecting portion 105 is inserted into an attachment hole 120 from the front side of the plate 150, the extending portions 103b and 103c of the main body 103 abut the front surface of the plate 150. Then, the main body 103 is pressed further to thrust the connecting portion 105 back into the attachment hole 120 while thereby elastically deforming the extending portions 103b and 103c, with the result that the retaining portion 107 and the first projection 109 pass through the plate 150 to reach the reverse side thereof.

Subsequently, the main body 103 is moved in the direction parallel with the front and reverse surfaces of the plate 150 until the first projection 109 is stuck in an engagement hole 130 and the abutting portion 107a of the retaining portion 107 abuts the reverse surface of the plate 150. In this state, the extending portions 103b and 103c as parts of the main body 103 are elastically deformed. Such elastic deformation causes the abutting portion 107a of the retaining portion 107 to be pressed against the reverse surface of the plate 150 and therefore prevents the connecting portion 105 from moving further in the direction of being removed from the attachment hole 120. In addition, since the second projection 111 engages with a locating hole 140 formed in the plate 150, the clamp of the plate 150.

Figure 4:
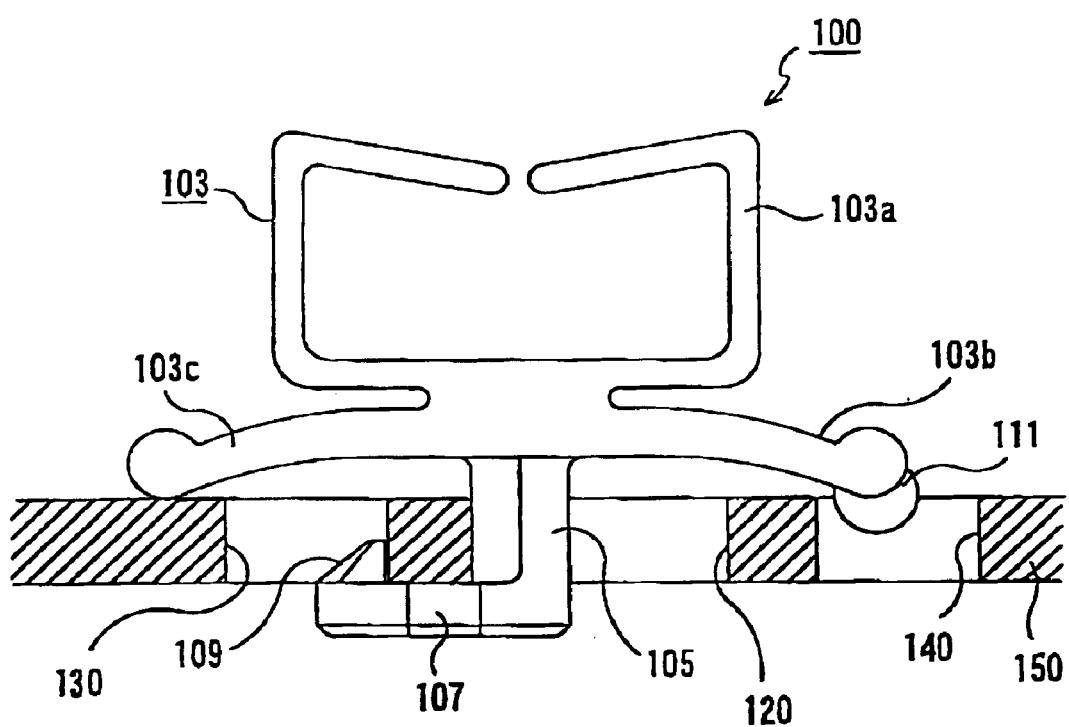
FIG. 4 is a front view showing the state of the clamp according to the second embodiment fixed to a plate.

As a result, as shown in FIG. 4, the clamp 100 is fixed to the plate 150.

To detach the clamp 100 which has been fixed in the above described manner from the plate 150, firstly the main body 103 is pressed against the front surface of the plate 150 and the extending portions 103b and 103c are elastically deformed further until the first projection 109 is removed from the engagement hole 130. While keeping the above state, the main body 103 is moved in the direction parallel with the front and reverse surfaces of the plate 150 until the retaining portion 107 is moved to the point where it does not overlap the reverse surface of the plate 150. This enables the connecting portion 105, the retaining portion 107, and the first projection 109 to be pulled out of the attachment hole 120 toward the front side of the plate 150.

The clamp 100 having the above described fixing structure can be detached from the plate 150 by mere handling of the same on the front side of the plate 150 without reaching around to reverse side of the plate 150. Therefore, even if there is not room enough for a hand to be inserted around to the reverse side of the plate 150, the clamp 100 can easily be detached. This enables detachment of the clamp 100 with less trouble compared with a conventional clamp when, for example, the clamp 100 and the plate 150 are to be separately disposed at the time of discarding a product, or the clamp 100 is to be reused.

Furthermore, the retaining portion 107 comprising a plate-like member disposed in parallel with the front and reverse surfaces of the plate facilitates a relatively small structure of the portion protruding from the reverse side of the plate 150, compared with a conventional clamp, thereby achieving a small amount of protrusion on the reverse side of the plate 150. Therefore, it is possible to miniaturize electronic equipment by reducing the necessary space on the reverse side of the plate 150.

A further advantage is that displacement of the clamp 100 hardly occurs because the first projection 109 and the second projection 111 cooperatively prevent, on both the front and reverse sides of the plate 150, the clamp 100 from moving in the direction parallel with the front and reverse surfaces of the plate 150.

A modified example shown in FIGS. 5A and 5B will now be described.

Figure 5A:
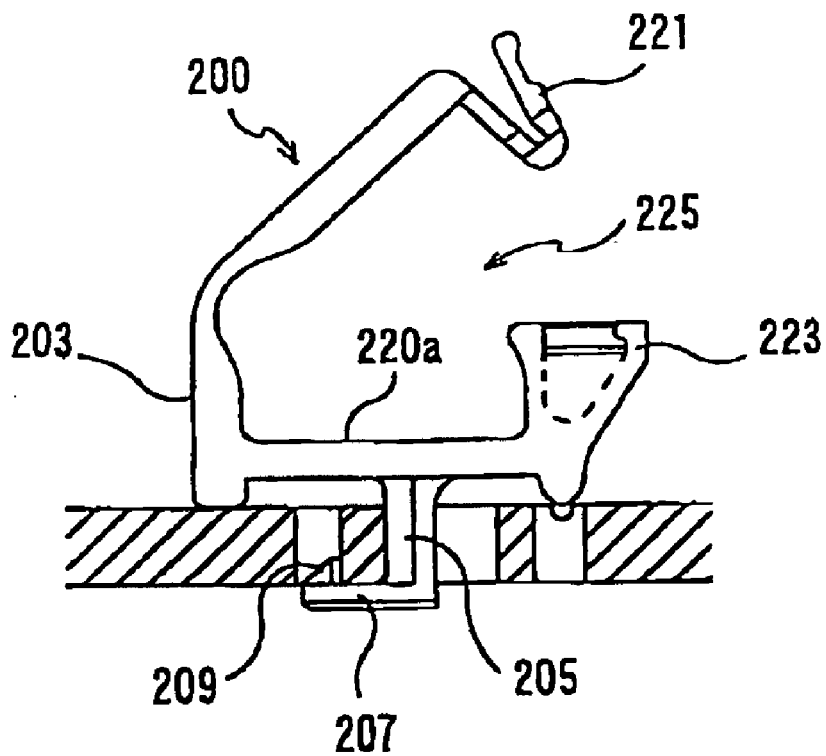
FIG. 5A is a front view showing the state of a clamp as a modified example fixed to the plate.
Figure 5B:
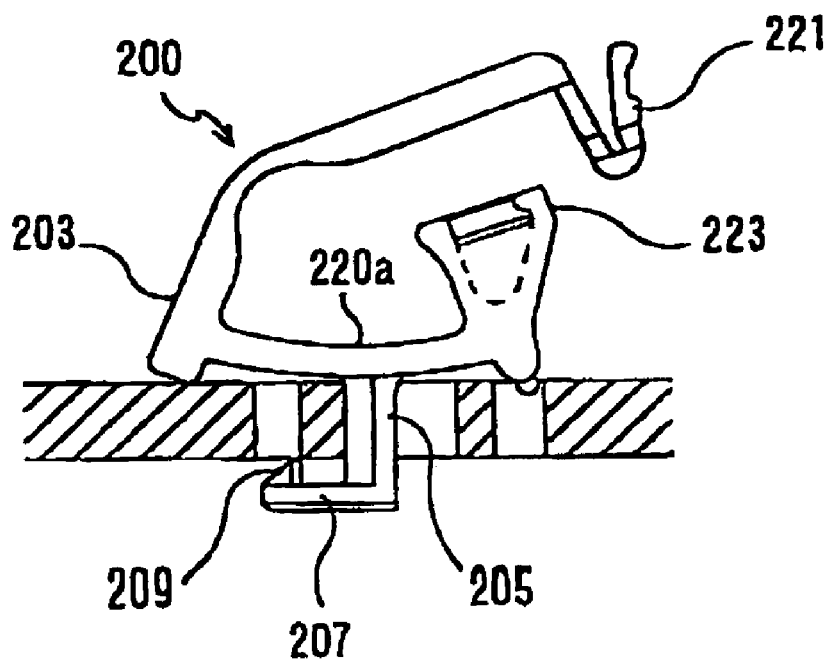
FIG. 5B is a front view showing the state of elastic deformation of a main body.

A clamp 200 in FIGS. 5A and 5B is provided with an electrical wire bundle holding portion 225, which is made perfectly annular with its ring opening closed when an engaging portion 221 and a portion to be engaged 223 engage with each other. The clamp 200 has a plate-like portion 220a gin a main body 203 which is elastically deformable, instead of having extending portions which extend from the main body.

the second embodiment described above, each of the outer surface 105a and the inner surface 105b of the connecting portion 105 is configured as part of a cylindrical surface, the same as in the first embodiment. Accordingly, by taking advantage of these cylindrical surfaces, the effect of easy attachment described with respect of the first embodiment referring to FIG. 2B is attained also in the second embodiment.

Although a clamp for holding a bundle of electrical wires is shown in each of the first and the second embodiments, the fixing structure according to the present invention can be employed in any members to be attached to the plate. One application is a spacer comprising a support provided with fixing members at both ends thereof. Such a spacer can be attached/detached by handling only from the front side of the plate and achieve a reduced amount of protrusion on the reverse side of the plate.

What is claimed is:

1. A clamp for affixing an electrical component to a plate, the clamp comprising a main body and an integral fixing member;

the main body defining a central axis;

the fixing member comprising of a support protruding from a base of the main body with a disc portion being supported at a remote end of the support;

the support comprising a first curved surface and a second curved surface, with the first and second curved surfaces abutting one another along opposed ridges which define boundaries between the two curved surfaces;

first and second elastically deformable portions extending from the base of the main body, where at least one of the first and second elastically deformable portions has at least one projection at a remote free end thereof, and the first elastically deformable portion extends in a first direction and the second elastically deformable portion extends in a second opposite direction;

wherein at least a portion of the support is coincident with the central axis of the main body and the disc portion defines a disc axis which is offset from the central axis of the main body such that the disc portion is located closer to the first elastically deformable portion than to the second elastically deformable portion.

2. The clamp according to claim 1, wherein the main body has a generally c-shaped configuration for supporting the electrical component once the electrical component passes through an opening of the main body.

3. The clamp according to claim 2, wherein the disc portion is circular and the first curved surface has the same curvature as the curvature of the disc portion.

4. The clamp according to claim 3, wherein a portion of the first curved surface is coincident with the central axis of the main body.

5. The clamp according to claim 4, wherein a portion of the second curved surface is coincident with the disc axis of the disc portion.

6. The clamp according to claim 5, wherein both the first and second elastically deformable portions have projections at remote ends thereof.

7. The clamp according to claim 6, wherein both the first and the second elastically deformable portions are substantially planar curved surfaces and each of the curved surfaces defines an arc.

8. The clamp according to claim 6, wherein in order to attach the cramp to a plate, the first and second elastically deformable portions are elastically deformed, passing the disc portion through a circular attachment hole having an attachment hole axis provided in the plate, once the disc is through the attachment hole the clamp is moved transversely in the first direction to engage one or more projections in one or more corresponding engagement recesses provided in the plate, causing a subsequent reduction of the elastic deformation of the first and second elastically deformable portions; and in order to detach the damp from the plate, the clamp is moved relative to the plate in the second direction, causing the first and second elastically deformable portions to elastically deform further as the projection disengage from corresponding engagement recesses provided in the plate, until the dice axis is substantially aligned with the attachment hole axis thereby facilitating removal of the clamp from the plate.

9. The clamp according to claim 2, wherein a portion of the first curved surface is coincident with the central axis of the main body.

10. The clamp according to claim 2, wherein a portion of the second curved surface is coincident with the disc axis of the disc portion.

11. The clamp according to claim 2, wherein both the first and second elastically deformable portions have projections at remote ends thereof.

12. The clamp according to claim 2, wherein both the first and the second elastically deformable portions are substantially planar curved surfaces and each of the curved surfaces defines an arc.

13. The clamp for affixing an electrical component to a plate, the clamp comprising a main body and an integral fixing member;

the main body defining a central axis;

the fixing memory comprising a support protruding from a base of the main body with a disc portion having a disc axis and being supported at a remote end of the support;

the support comprises a first curved surface and a second curved surface with the first and second curved surfaces abutting one another along opposed first and second ridges which define boundaries between the two curved surfaces;

first and second elastically deformable portions extending from the base of the main body, at least one of the first and second elastically deferrable portions having at least one projection at a remote free and thereof, and the first elastically deformable portion extends in a first direction and the second elastically deformable portion extends in a second opposite direction;

wherein at least a portion of the support is coincident with the central axis of the main body and the disc portion defines the disc axle which is offset from the central axis of the main body such that the disc portion is located closer to the first elastically deformable portion than to the second elastically deformable portion; and in order to latch the clamp from a plate,the main body is rotated about an axis orthogonal to the surface of the plate, where one of the first or second ridge boundaries is coincident to the axis of rotation, and where the first and second elastically deformable portions are further elastically deformed due to the at least one projection on the remote free end leaving a corresponding engagement recess provided in the plate and moving in sliding contact across the surface of the plate, until the clamp is rotated to such a degree that the first or second curved surface is substantially flush with an inner wail of an access hole, facilitating removal of the clamp along the axis of rotation.

14. The clamp according to claim 13, wherein the main body has a generally C-shaped configuration for supporting the electrical component once the electrical component passes through an opening of the main body.

15. The clamp according to claim 14, wherein the disc portion is circular and the first curved surface has the same curvature as a curvature of the disc portion.

16. The clamp according to claim 15, wherein a portion of the first curved surface is coincident with the central axis of the main body.

17. The clamp according to claim 16, wherein a portion of the second curved surface is coincident with the disc axis of the disc portion.

18. The clamp according to claim 13, wherein a portion of the first curved surface is coincident with the central axis of the main body.

19. The clamp according to claim 13, wherein a portion of the second curved surface is coincident with the disc axis or the disc portion.

20. A clamp for affixing an electrical component to a plate, the clamp comprising a main body and an integral fixing member;

the main body defining a central axis;

the fixing member comprising of a support protruding from a base of the main body with a disc portion having a disc axis and being supported at a remote end of the support;

the support comprising a first curved surface and a second curved surface, with the first and second curved surfaces abutting one another along opposed ridges which define boundaries between the two curved surface;

wherein the disc portion is circular and defines the disc axis;

the first arid second curved surfaces have a same curvature as a curvature of the disc portion;

a portion of the first curved surface is coincidental to the central axis;

a portion of the second curved surface is coincidental to the disc axis of the disc portion;

a first and second elastically deformable portions extending from the base of the main body, at least one of the first and second elastically deformable portions having at least one projection at a remote free end thereof, and the first elastically deformable portion extends in a first direction and the second elastically deformable portion extends in a second opposite direction.

* * * * *